(12) United States Patent
Liu et al.

(10) Patent No.: US 6,862,784 B2
(45) Date of Patent: Mar. 8, 2005

(54) METHOD OF FABRICATING A WOUND CAPACITOR

(75) Inventors: Tao Liu, University Place, WA (US); Steve Schiveley, Forest Grove, OR (US); Peir Chu, Portland, OR (US); Mike Greenwood, Oregon City, OR (US); Aaron Steyskal, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/345,147

(22) Filed: Jan. 16, 2003

(65) Prior Publication Data

US 2003/0103317 A1 Jun. 5, 2003

Related U.S. Application Data

(62) Division of application No. 09/964,806, filed on Sep. 28, 2001, now Pat. No. 6,529,365.

(51) Int. Cl.[7] ............................................... H01G 4/18

(52) U.S. Cl. .................... 29/25.42; 29/25.03; 29/25.01; 361/307; 361/323

(58) Field of Search .............................. 361/307–323, 361/511, 518, 532, 508, 509, 528; 29/25.42, 25.03, 25.01, 602.1, 605, 608; 336/192, 223; 428/461, 322

(56) References Cited

U.S. PATENT DOCUMENTS

| | | | |
|---|---|---|---|
| 5,359,487 A | | 10/1994 | Carrico et al. |
| 5,676,305 A | * | 10/1997 | Potter et al. ................. 228/207 |
| 5,926,375 A | * | 7/1999 | Watanabe et al. ............ 361/760 |
| 6,110,233 A | | 8/2000 | O'Phelan et al. |
| 6,310,780 B1 | * | 10/2001 | Tamura et al. .............. 361/761 |
| 6,529,365 B1 | * | 3/2003 | Liu et al. ..................... 361/307 |
| 6,558,436 B1 | * | 5/2003 | Greenwood et al. ....... 29/25.03 |

* cited by examiner

Primary Examiner—Minh Trinh
(74) Attorney, Agent, or Firm—B. Delano Jordan

(57) ABSTRACT

A method of fabricating a capacitor provides for coupling a ball grid array (BGA) lead configuration to a foil and disposing the foil within a case. The BGA lead configuration extends from the case.

7 Claims, 4 Drawing Sheets

METHOD OF FABRICATING A WOUND CAPACITOR

CROSS-REFERENCE TO RELATED APPLICATIONS

This patent application is a divisional application of U.S. application Ser. No. 09/964,806, filed on Sep. 28, 2001, now U.S. Pat. No. 6,529,365, and may benefit from the priority thereof.

BACKGROUND OF THE INVENTION

1. Technical Field

The present invention generally relates to capacitors. More particularly, the invention relates to a ball grid array (BGA) style capacitor having a reduced equivalent series resistance (ESR) and equivalent series inductance (ESL).

2. Discussion

In the highly-competitive personal computer (PC) industry, the difficult trade-off between cost and performance has been well documented. For example, in an effort to provide more features to the consumer at a lower cost, significant focus has been placed on streamlining motherboard systems and components. Most motherboards employ one or more voltage regulation circuits to ensure that the proper reference voltages are supplied to the motherboard processors and it has been determined that such a circuit has a direct effect on the switching performance of the processor. The voltage regulation circuit typically has a voltage regulation module and a capacitor arrangement (among other components). The capacitor arrangement is critical because it provides decoupling between the voltage regulation module (VRM) and the processor. Conventional approaches to the capacitor arrangement involve the use multiple high performance bulk-type capacitors, which can have very low equivalent series resistance (ESR), temperature stability, wide frequency range and long life. Low ESR reduces the unwanted parasitic impedance and heating effects that degrade capacitors and is highly desirable in the computing industry. The cost of these performance capacitors, however, is relatively high with respect to other capacitors. It is therefore desirable to provide an alternative to conventional performance capacitors in voltage regulation circuits.

The alternative approach to the above design would be to use a combination of ceramic and conventional electrolytic capacitors, which would reduce the costs of the capacitor arrangement considerably. The trade-off to reduced cost, however, is reduced performance under conventional approaches.

Thus, the conventional capacitor arrangement provides a significant cost saving opportunity, but certain difficulties remain. For example, the typical wound aluminum electrolytic capacitor is unable to meet the exacting ESR and equivalent series inductance (ESL) requirements of modern day high speed processors. FIGS. 1–3 illustrate that the conventional wound capacitor 10 has a case 12, a winding 14 disposed within the case 12 and a dual lead configuration 16. The dual lead configuration 16 is coupled to the winding 14 and extends from the case 12 for connection to an external printed wiring board (PWB, not shown). It can be seen that the dual lead configuration 16 has a cathode terminal assembly 18 and anode terminal assembly 20. Each terminal assembly 18, 20 includes a termination 22, a lead 24, and a weld 26 coupling the termination 22 to the lead 24.

It has been determined that the design of the dual lead configuration 16 can be quite challenging with regard to ESR and ESL. For example, limiting the lead configuration to two terminal assemblies has been found to contribute to a relatively high ESR in a capacitor of this type. The distance between terminal assemblies 18 and 20 has a significant impact on ESR and ESL.

It is also important to note that the weld 26 contributes to loop ESL and that the relatively long two-piece termination/lead design adds to both loop ESL and ESR. It is therefore desirable to provide a lead configuration that enables ESR to be reduced without sacrificing with respect to ESL.

It will also be appreciated that certain manufacturing and placement difficulties can also result from the conventional capacitor 10. For example, the typical solder connection that occurs at the leads 24 requires wave soldering, which prohibits the use of the capacitor 10 in dual-sided reflow PWBs. Furthermore, the traditional case 12 can be relatively tall, which limits the use of the capacitor 10 to applications having a great deal of clearance space. Tall body and long leads contribute to higher ESR/ESL as well. Redesign of the height could bring the ESR/ESL down. It is therefore desirable to provide a solution that enables dual-sided reflow techniques commonly used in surface mount technologies (SMT), and greater flexibility in capacitor placement.

BRIEF DESCRIPTION OF THE DRAWINGS

The various advantages of the present invention will become apparent to one skilled in the art by reading the following specification and appended claims, and by referencing the following drawings in which:

DETAILED DESCRIPTION OF THE PREFERRED EMBODIMENT

A capacitor and method of fabricating a capacitor in accordance with the principles of the present invention provide enhanced performance. The capacitor has a case and a wound foil disposed within the case. A ball grid array (BGA) lead configuration is coupled to the foil and extends from the case. The use of BGA technology for the lead configuration provides substantial benefits with respect to ESR, ESL, manufacturability and placement.

In another aspect of the invention, a BGA lead configuration of a capacitor includes a plurality of cathode terminations having first ends coupled to a first surface of a foil.

A plurality of anode terminations have first ends coupled to a second surface of the foil. The lead configuration further includes of plurality of BGA bumps coupled to second ends of the terminations, where the BGA bumps enable electrical connection of the lead configuration to a printed wiring board (PWB).

In another aspect of the invention, a method of fabricating a capacitor is provided. A case is provided, and a BGA lead configuration is coupled to a foil. The method further provides for disposing the foil within the case such that the lead configuration extends from the case.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

Figure 1:
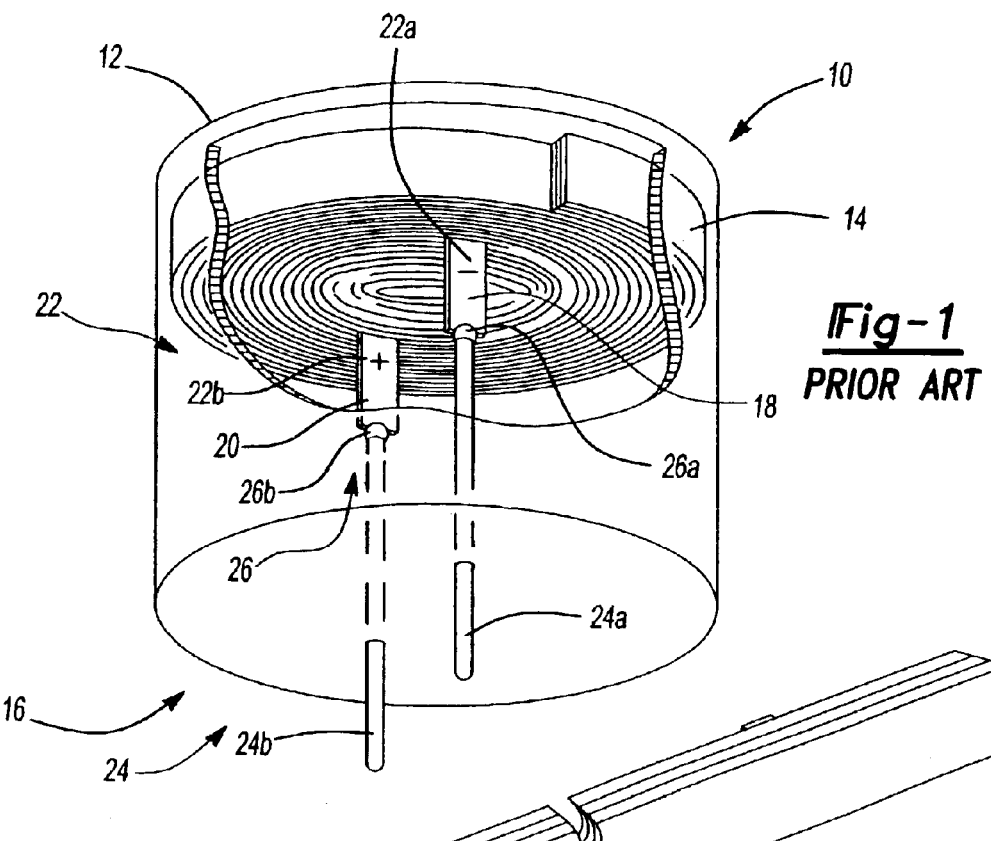
FIG. 1 is a perspective view of a conventional wound capacitor, useful in understanding the invention.
Figure 2:
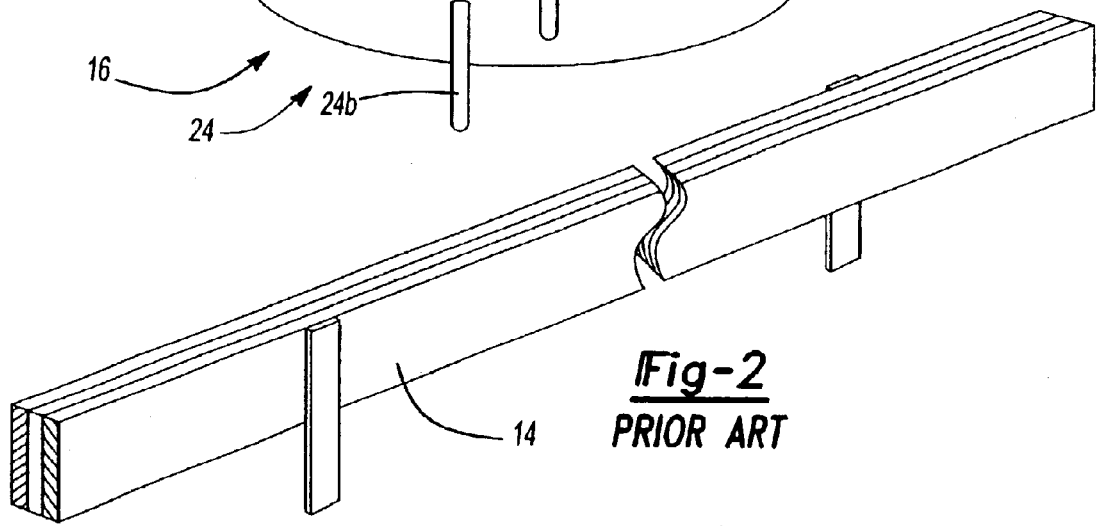
FIG. 2 is a view of a first surface of a conventional foil before winding, useful in understanding the invention.
Figure 3:
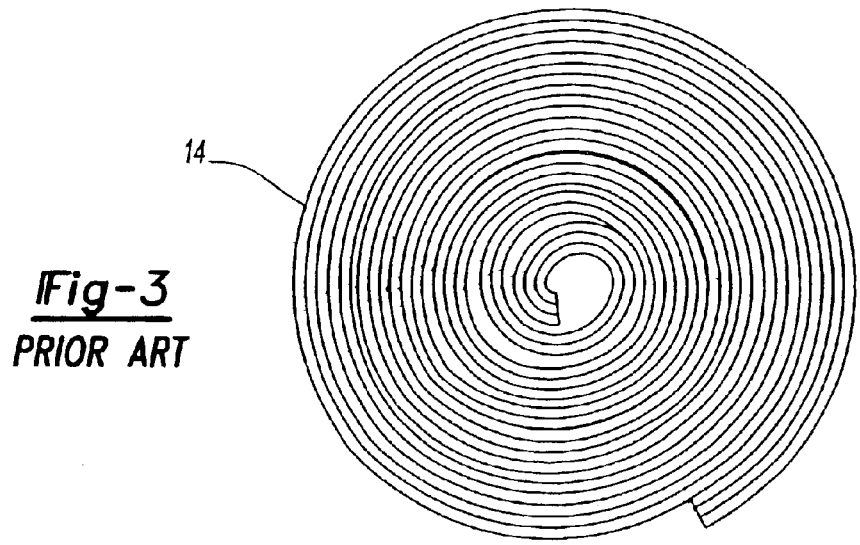
FIG. 3 is a sectional view of a conventional capacitor, useful in understanding the invention.
Figure 4:
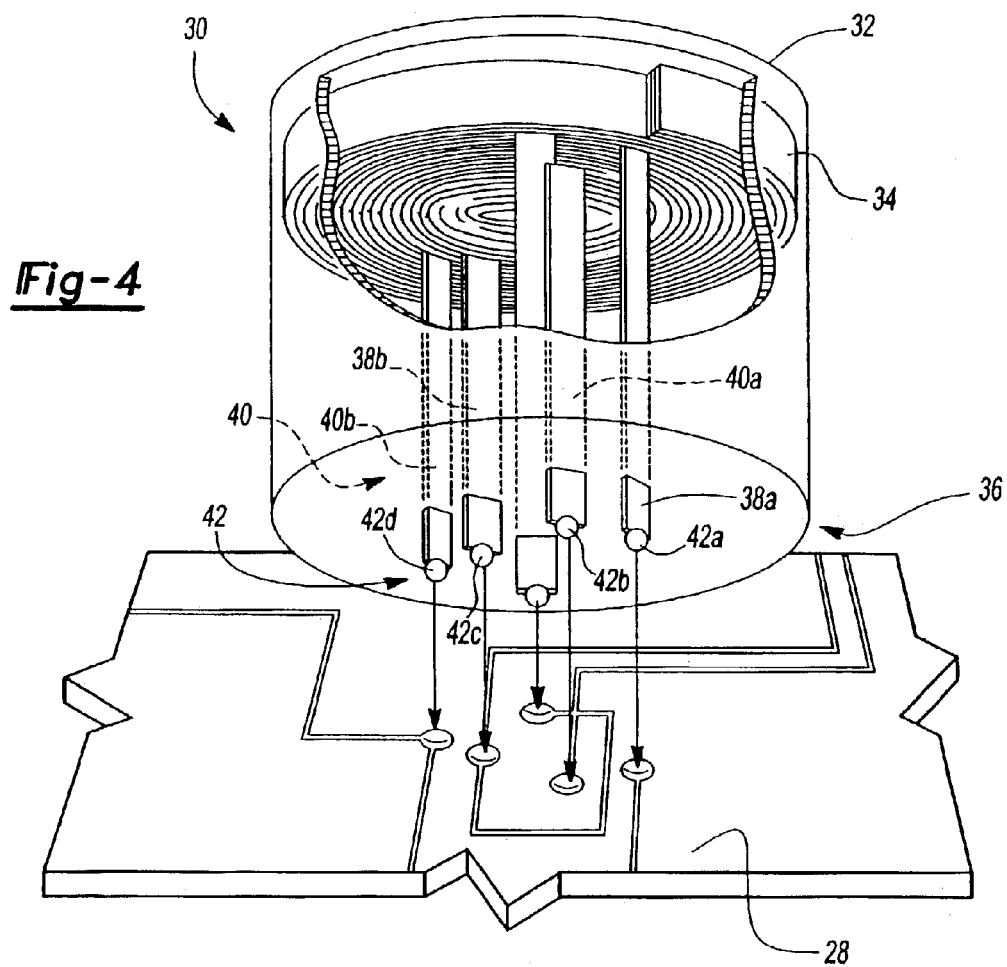
FIG. 4 is a perspective view of an example of a capacitor in accordance with one embodiment of the present invention.

FIG. 4 shows a wound capacitor 30 having significantly improved equivalent series resistance (ESR) and equivalent series inductance (ESL) as well as enhanced manufacturability and placement flexibility. While the capacitor 30 will be primarily described with respect to a motherboard voltage regulation circuit, it is important to note that the invention is not so limited. In fact, the capacitor 30 can be beneficial to any application in which ESR, ESL, manufacturability or placement are of concern. Notwithstanding, motherboard voltage regulation circuits have a number of aspects for which the capacitor 30 is uniquely suited.

Figure 5:
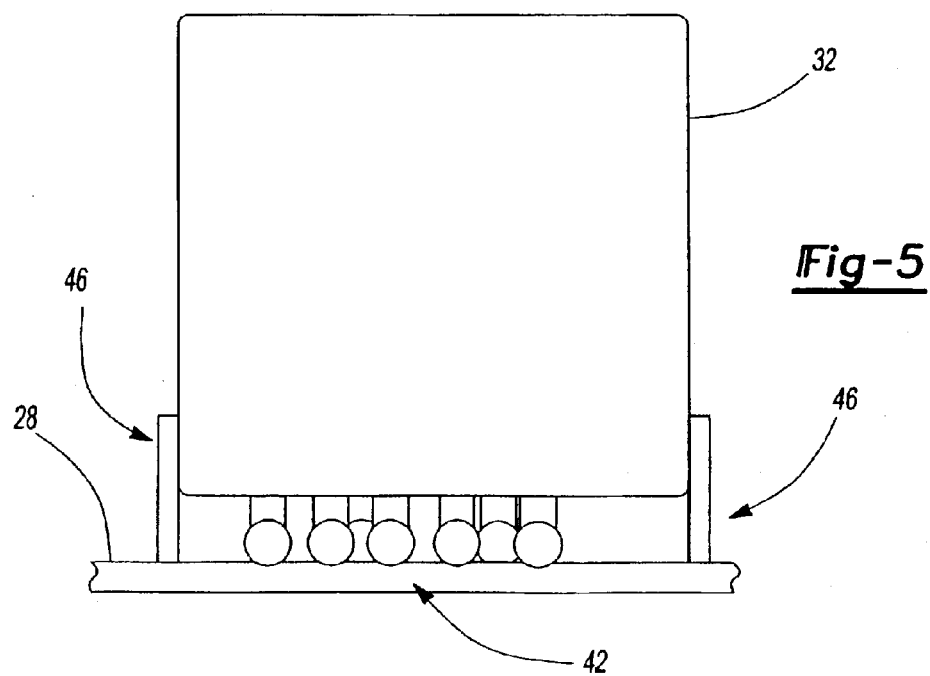
FIG. 5 is a side view of the capacitor shown in FIG. 2.

It can generally be seen that the capacitor 30 has a case 32 and a wound foil 34 disposed within the case 32. A ball grid array (BGA) lead configuration 36 is coupled to the foil 34 and extends from the case 32. More particularly, it is preferred that the lead configuration 36 includes a plurality of cathode terminations 38 having first ends coupled to a first surface of the foil 34. A plurality of anode termination 40 have first ends coupled to a second surface of the foil 34. As will be discussed greater detail below, the foil 34 can be an aluminum foil of the type that is commercially available and widely used in the industry. U.S. Pat. No. 6,110,233 to O'Phelan et al. describes one such foil, but other techniques may be used without parting from the nature and scope of the invention. It can further be seen that the lead configuration 36 includes a plurality of BGA bumps 42 coupled to second ends of the terminations 38, 40, where the BGA bumps 42 enable electrical connection of the lead configuration to a printed wiring board 28 as best shown in FIG. 5.

Figure 6:
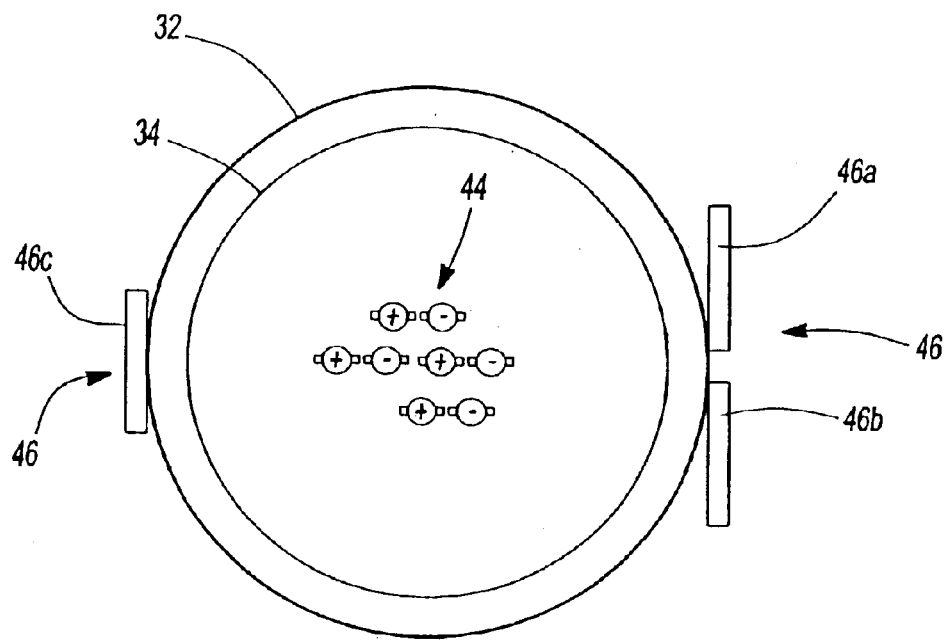
FIG. 6 is a bottom view of an example of a capacitor in accordance with one embodiment of the present invention.
Figure 7:
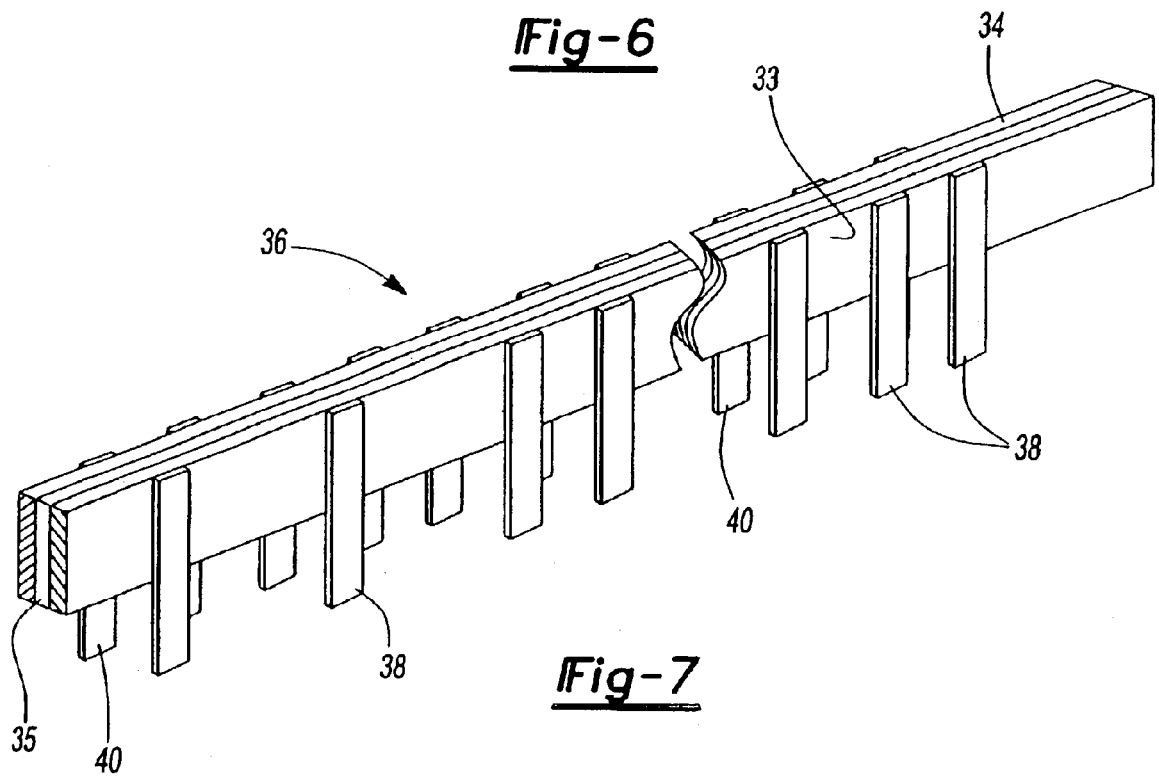
FIG. 7 is a view of an example of a foil and BGA lead configuration before winding in accordance with one embodiment of the present invention.

Turning now to FIG. 7, it can be seen that the foil 34 is made up a first surface 33, a second surface (not shown) and a dielectric layer 35 "sandwiched" between two foil surfaces. The surfaces of the foil 34 are preferably electrically conductive layers that are deposited on, grown on, or otherwise attached to the dielectric layer 35. Although the terminations 38, 40 are shown as being attached to the sides of the electrically conductive layers that face outward with respect to the dielectric layer 34, the inward facing sides may also be used. Furthermore, it should be noted that the terminations 38, 40 may be coupled to either side of the foil 34, and that coupling may be accomplished by welding, soldering, swagging, electrically conductive adhesive or any other suitable technique. FIG. 6 demonstrates that the resulting BGA field 44 enables the terminations 38, 40 to be closely spaced together in order to achieve low ESL.

It is important to note that the close spacing does not result in high ESR as would occur under conventional approaches, for a number of reasons. One reason is that using multiple terminations is equivalent to putting resistors in parallel, which reduces ESR. For example, the cathode terminations 38$a$ and 38$b$ shown in FIG. 4 combine to yield a smaller resistance than would be obtained from either of the terminations alone. The same is true for the anode terminations 40. Thus, multiple terminal drops reduce ESR while at the same time closely arranged terminal drops result in cancellation of mutual inductance and reduced loop ESL.

With continuing reference to FIGS. 1–7, it will be appreciated that eliminating the conventional weld further reduces loop ESL and the shorter terminations 38, 40 reduce both loop ESL and ESR. It should further be noted that the terminations 38, 40 have a variable pitch such that the capacitor 30 can be provided with a predetermined ESR and a predetermined ESL if the particular application calls for specific values.

Additionally, by using a BGA can, the physical height of the capacitor is reduced, which enables the component to fit into height-constrained locations. Furthermore, the BGA bumps 42 enable surface mount connection of the lead configuration 36 to the PWB 28. As best shown in FIGS. 5 and 6, the case preferably includes a plurality of orientation pins 46 extending from the case 32, where the orientation pins 46 facilitate assembly of the capacitor 30 to the PWB 28. Specifically, the orientation pins 46 prevent misorientation of the capacitor 30 during board assembly and provide improved stability as the board is soldered. In this regard, it has been determined that conventional wound capacitors can be inserted backwards, causing dramatic failures and may require a hold-down feature to prevent wobbling as the board goes through wave soldering.

Figure 8:
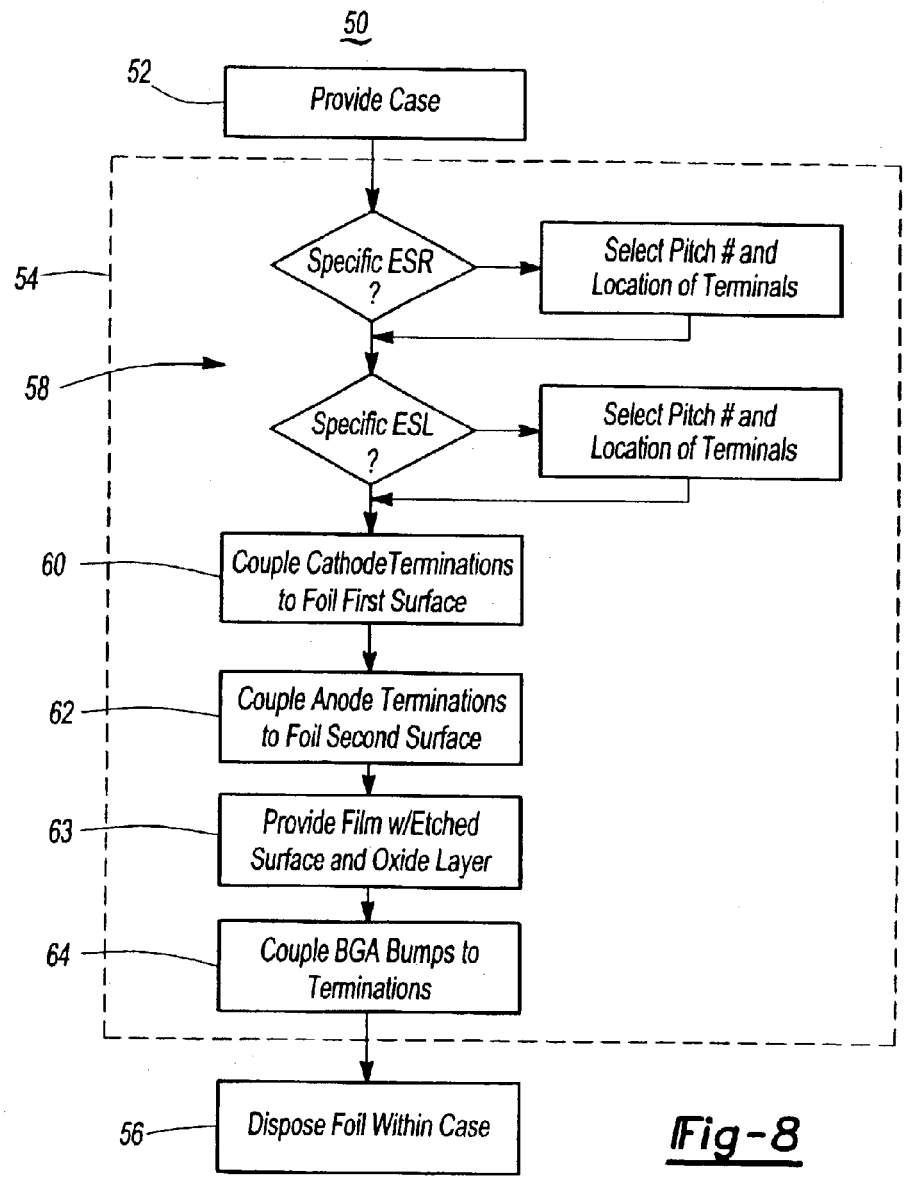
FIG. 8 is a flowchart of an example of a method of fabricating a capacitor in accordance with one embodiment of the present invention.

Turning now to FIG. 8, it will be appreciated that the present invention further provides a method 50 of fabricating a capacitor. Generally, a case is provided at processing block 52 and a BGA lead configuration is coupled to a foil at block 54. The foil is then disposed within the case at block 56 (after being wound) such that the lead configuration extends from the case. It is preferred that blocks 58 provide for selecting the pitch, number and location of the terminations to be in accordance with any predetermined ESR or ESL that might be specified. First ends of a plurality of cathode terminations are coupled to a first surface of the foil at block 60. Block 62 provides for coupling first ends of a plurality of anode terminations to a second surface of the foil. A film with an etched surface and oxide layer is provided for at block 63 in order to achieve an appropriate dielectric layer. It should be noted that the resulting foil can be achieved through standard etching, oxidation and alignment processes. It can further be seen that a plurality of BGA bumps are coupled to second ends of the terminations at block 64, where the BGA bumps enable electrical connection of the lead configuration to the PWB.

It will be appreciated that the order in which the processing blocks are performed may vary without parting from the nature and scope of the invention. For example, the BGA bumps may be coupled to the terminations before the terminations are coupled to the foil. It should also be noted that the BGA bumps enable surface mount connection of the lead configuration to the PWB.

Figure 9:
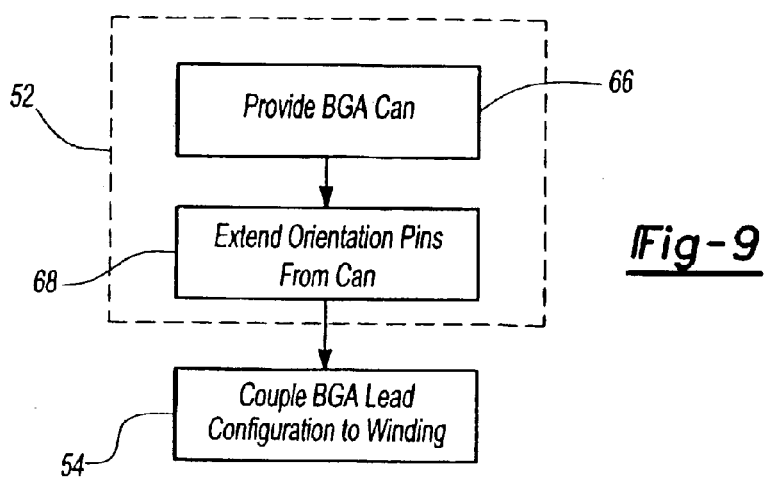
FIG. 9 is a flowchart of an example of a process of providing a case in accordance with one embodiment of the present invention.

Turning now to FIG. 9, the preferred approach to providing a case for the capacitor is shown. Specifically, a BGA can is provided at step 66, which enables the overall height of the capacitor to be significantly reduced. Block 68 provides for extending a plurality of orientation pins from the case, where the orientation pins facilitate assembly of the capacitor to a PWB. The orientation pins may be of any shape and number, and can be coupled to the BGA can by any acceptable technique. For example, in the illustrated embodiment (FIG. 6), three orientation pins 46a, 46b, 46c, have a rectangular shape and are welded to an outer surface of the case 32. FIG. 5 shows that corresponding apertures are provided in the PWB 28 to facilitate alignment of the BGA bumps 42 with the corresponding set of BGA pads on the upper surface of the PWB 28.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

It is claimed that:

1. A method of fabricating a capacitor, the method comprising:

providing a case;

coupling a ball grid array (BGA) lead configuration to a foil; and disposing the foil within the case, the lead configuration extending from the case, wherein coupling the BGA lead configuration to the foil includes coupling first ends of a plurality of cathode terminations to a first surface of the foil, coupling first ends of a plurality of anode terminations to a second surface of the foil, and coupling a plurality of BGA bumps to second ends of the cathode terminations and to second ends of the anode terminations.

2. The method of claim 1 further including selecting a pitch of the cathode terminations and the anode terminations such that the capacitor has a predetermined equivalent series inductance.

3. The method of claim 1 further including selecting a pitch of the cathode terminations and the anode terminations such that the capacitor has a predetermined series inductance.

4. The method of claim 1 further including forming a surface mount connection between the BGA bumps of the lead configuration and a printed wiring board.

5. The method of claim 1 wherein providing the case includes providing a BGA can.

6. The method of claim 1 further including extending a plurality of orientation pins from the case.

7. The method of claim 1 further including winding the foil such that the wound foil has an outer diameter that is less than an inner diameter of the case.

* * * * *